United States Patent [19]

Isaka et al.

[11] Patent Number: 5,317,363
[45] Date of Patent: May 31, 1994

[54] IMAGE FORMING APPARATUS USING DRY SILVER SALT MATERIAL

[75] Inventors: Kazuo Isaka, Tokyo; Akihiro Mouri, Kokubunji; Masato Katayama, Yokohama; Tetsuro Fukui, Kawasaki; Yoshinobu Shiraiwa, Machida, all of Japan

[73] Assignee: Canon Kabushiki Kaisha, Tokyo, Japan

[21] Appl. No.: 742,727

[22] Filed: Aug. 6, 1991

Related U.S. Application Data

[63] Continuation of Ser. No. 558,705, Jul. 27, 1990, abandoned.

[30] Foreign Application Priority Data

Jul. 28, 1989 [JP] Japan .................. 1-195628

[51] Int. Cl.⁵ .................. G03B 27/32; G03B 27/52
[52] U.S. Cl. .......................... 355/27; 355/70; 355/67
[58] Field of Search .................. 355/70, 27, 67

[56] References Cited

U.S. PATENT DOCUMENTS

| | | |
|---|---|---|
| 3,528,737 | 9/1970 | Denner ............ 355/67 |
| 3,823,413 | 7/1974 | Cole ............ 355/67 |
| 3,944,361 | 3/1976 | Inoue et al. ............ 355/27 |
| 4,089,016 | 5/1978 | Orlando ............ 354/202 FF |
| 4,185,914 | 1/1980 | Holthusen ............ 355/70 |
| 4,537,500 | 8/1985 | Nemesnyik ............ 354/202 FF |
| 4,624,910 | 11/1986 | Takeda ............ 430/203 |
| 4,634,244 | 1/1987 | Jobin ............ 354/202 FF |
| 4,649,098 | 3/1987 | Takeda ............ 430/270 |
| 4,875,073 | 10/1989 | Ueda et al. ............ 355/27 |

FOREIGN PATENT DOCUMENTS

| | | |
|---|---|---|
| 0332455 | 9/1987 | European Pat. Off. |
| 3742902 | 6/1988 | European Pat. Off. |
| 0360014 | 3/1990 | European Pat. Off. |
| 410803 | 1/1991 | European Pat. Off. |

Primary Examiner—Monroe H. Hayes
Attorney, Agent, or Firm—Fitzpatrick, Cella, Harper & Scinto

[57] ABSTRACT

An image forming apparatus using dry silver salt material includes a photosensitive member having a base material and reducing material, photosensitive silver halide and organic silver salt which are on the base material; optical system for projecting information light onto the photosensitive member; auxiliary exposure optical system for uniformly exposing an entire surface of the photosensitive member; and a heating for uniformly heating the photosensitive member.

20 Claims, 13 Drawing Sheets

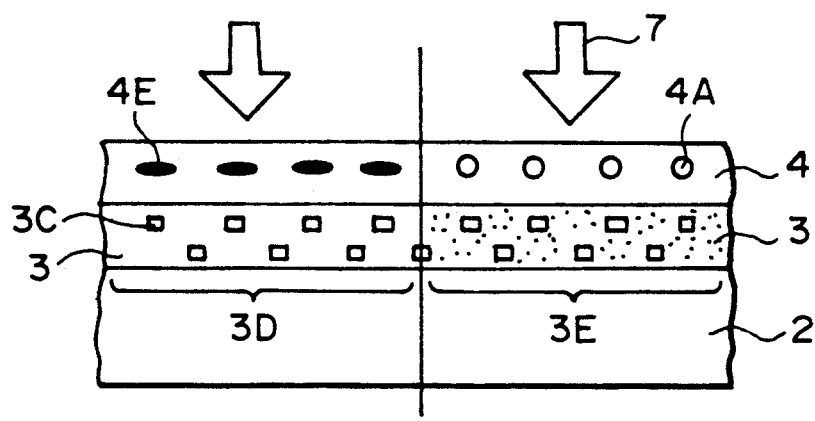
F I G. 5
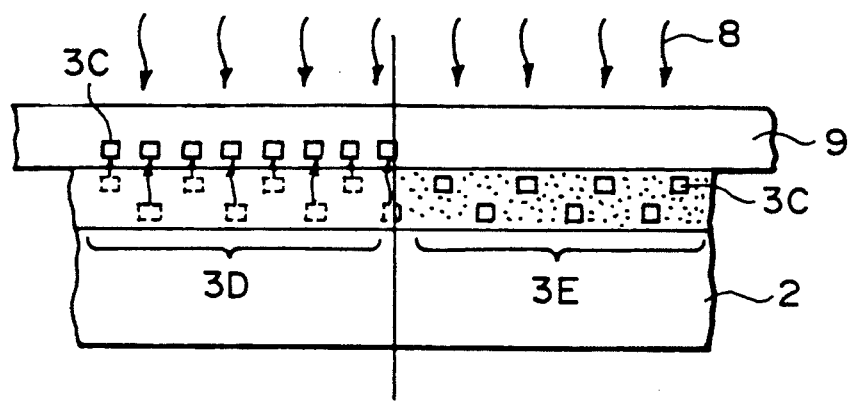
F I G. 6
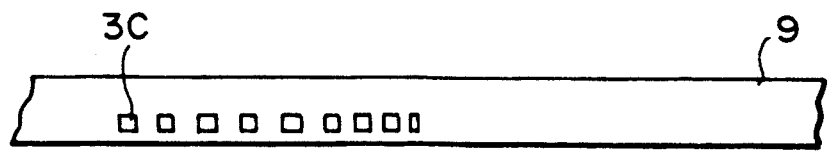
F I G. 7

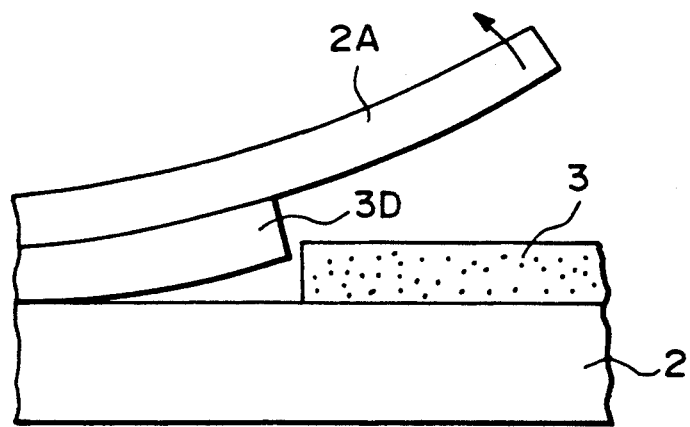
F I G. 9A
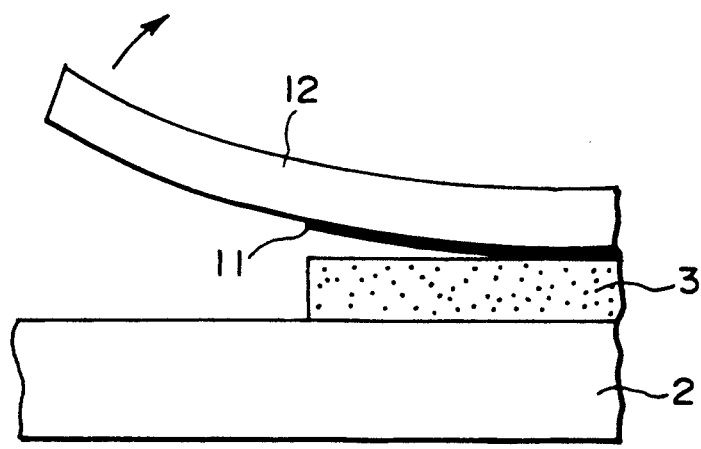
F I G. 9B

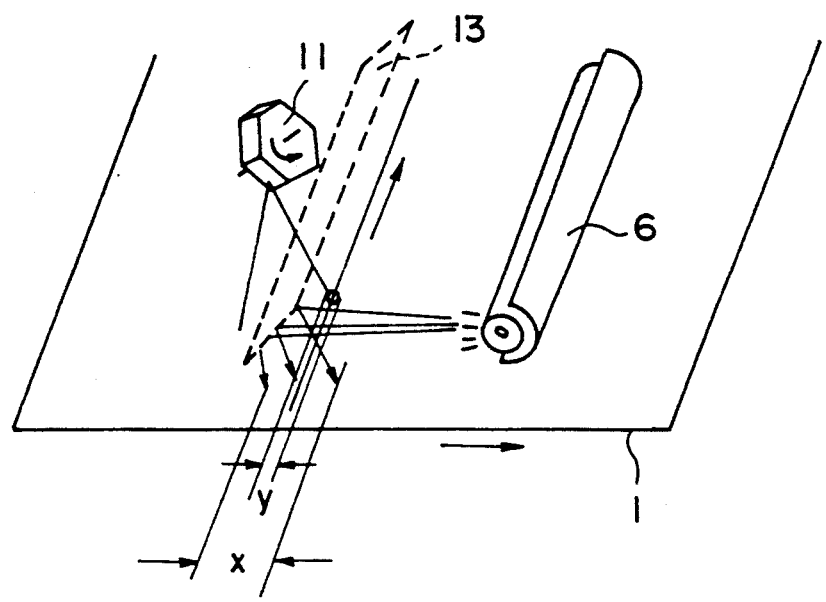
F I G. 14

IMAGE FORMING APPARATUS USING DRY SILVER SALT MATERIAL

This application is a continuation of U.S. application Ser. No. 07/588,705 filed Jul. 27, 1990, now abandoned.

FIELD OF THE INVENTION AND RELATED ART

The present invention relates to an image forming technique usable for a printer, a recording apparatus or the like, using dry silver salt material in a photosensitive member therein.

An image forming process of this type is disclosed in Japanese Patent Applications Nos. 7155/1988, 183441/1988, 207230/1988 and 251958/1988 (U.S. Ser. No. 302,270). The image formation mechanism in the process used in the inventive apparatus will first be described.

Referring first to FIG. 2, an enlarged sectional view of the photosensitive member is schematically shown. The photosensitive member 1 includes a resin film 2, a polymerization layer 3 and a photosensitive layer 4. The resin film 2 comprises polyester, polycarbonate, polyimide or aromatic polyamide or the like. The polymerization layer comprises monomer 3A, photopolymerization initiating material 3B and heat diffusible type dye 3C. The monomer 3A comprises trimethylol propanetriacrylate, dipentaerythritol hexaacrylate, or the like. The initiating material 3B comprises a material of a cleavage type such as benzyl dimethylketal or the like or a hydrogen removing type such as a combination of diethylthioxanthone and dimethylaminebenzolethyl. The dye 3C comprises styryl group, anthraquinone group or indoaniline group or the like. The photosensitive layer comprises reducing material 4A, photosensitive silver halide 4B and organic silver salt 4C. The reducing material 4A is 1-naphthol group, 2,2'-methylenebis(alkylphenol) group, 4,4'-methylenebis(alkylphenol) group or the like. The silver halide may comprise silver bromide, silver iodobromide, silver chlorobromide or the like. The organic silver salt 4C may comprise behenic acid silver or benzotriazole silver or the like. In this description, the polymerization layer and the photosensitive layer are separated. However, these layers may constitute a single layer. The photosensitive layer 4 may comprise sensitizing coloring, material such as cyanine, merocyanine or like having an absorption wavelength for the information light exposed. FIG. 3 shows the state in which the information light 5 is applied (image exposure) with a laser beam or infrared rays. By the optical energy of the information light, silver cores 4D are formed in the silver halide 4B in the photosensitive layer 4.

FIG. 4 shows the stat in which the photosensitive member 1 is heated by heat 6 by application of infrared rays or contact with a heated roller. Oxidation and reduction occur with the silver cores 4D acting as a catalyst, by which oxidized material 4E is produced by the reducing material. The preferable reducing material absorbs light having the wavelength component absorbed by the photopolymerization initiating material in the polymerization layer by the produced silver image, or reduces the amount of transmission light. Preferably, the oxidation material produced by the redox reaction absorbs the wavelength component absorbed by the photopolymerization initiating material. Then, a latent image having different transmissivities depending on the wavelength is formed in the photosensitive layer 4, corresponding to the applied image information.

In FIG. 5, the photosensitive layer 4 is exposed uniformly to light 7 from a light source having a predetermined wavelength range of 300–700 nm by, for example, a mercury vapor lamp or fluorescent lamp or the like. By this exposure, a chemical reaction occurs in the polymerization layer 3. By the uniform exposure, a photopolymerization reaction occurs, by which the monomer in the polymerization layer 3 is polymerized. An image is formed in the polymerization layer 3 by the different states of polymerization, the difference being between the unpolymerized region 3A and the photopolymerized region 3E.

In FIG. 6, the layer of the photosensitive member 1 is removed as desired, and a light receiving material 9 is overlaid o the polymerization layer 3. The photosensitive member 1 is heated by the heating means from the resin film 2 side. The image receiving material 9 has an image receiving layer comprising saturated polyester resin material, polyurethane resin material or the like. Therefore, as shown in FIG. 7, the heat diffusible dye 3C diffuses by the heat in the non-polymerized region, so that an image is formed on the image receiving layer of the image receiving material by dye 10.

In the example, the dye is contained in the polymerization layer, and the visualized image is formed with the dye diffused in the image receiving material. It is a possible alternative that an image can be formed in a different way using the proper difference of the polymerization layer between the polymerized region and non-polymerized region without using the dye layer.

FIGS. 8A, 8B and 8C show the layer structure of this type. As shown in FIG. 8A, the layer structure comprises resin film 2, a photosensitive layer 4 and a polymerization layer 3. The resultant polymer image has different surface adhesivenesses in the polymerized and non-polymerized regions.

In FIG. 8B, the layer structure comprises a resin film 2, a polymerization layer 3, an intermediate film 2A, a photosensitive layer 4 and resin film 2B. Using the difference in the adhesiveness of the polymerization layer, the intermediate film 2A, the resin film 2B layer and the layer therebetween are separated from the resin film 2.

In FIG. 8C, the polymerization layer 3 and the photosensitive layer 4 constitute a single layer, which is separated from the resin film 2.

For example, as shown in FIGS. 8B, 8C and 9A, because of the adhesiveness exhibited by the polymerization layer in the non-polymerized region, projections and pits are formed on the resin film when the intermediate film 2A is separated from the resin film 2 (base material). More particularly, as shown in FIG. 9B the pits and projection pattern is used as a master for printing, and off-set ink 11 or the like is applied on the surface, and plain paper or coated paper or another image receiving material 12 is overlaid, so that the image is transferred thereto.

SUMMARY OF THE INVENTION

Accordingly, it is a principal object of the present invention to provide an image forming apparatus using a dry silver salt, in which the sensitivity and the contrast of the image is high with stability.

It is another object of the present invention to provide an image forming apparatus using silver salt material, which is capable of providing good tone reproduction.

According to an embodiment of the present invention, there is provided an image forming apparatus using dry silver salt material, comprising: a photosensitive member having a base material and reducing material, photosensitive silver halide and organic silver salt which are on the base material; means for projecting information light onto said photosensitive member; auxiliary exposure means for uniformly exposing an entire surface of said photosensitive member; and means for uniformly heating said photosensitive member.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2, 3, 4, 5, 6 and 7 illustrate reactions in the photosensitive member used in the apparatus of the present invention.

FIGS. 9A and 9B illustrate behavior in the separation of layers of the photosensitive member.

FIG. 14 is a perspective view illustrating an example of exposure.

DESCRIPTION OF THE PREFERRED EMBODIMENTS

The preferred embodiments of the present invention will be described.

Figure 1:
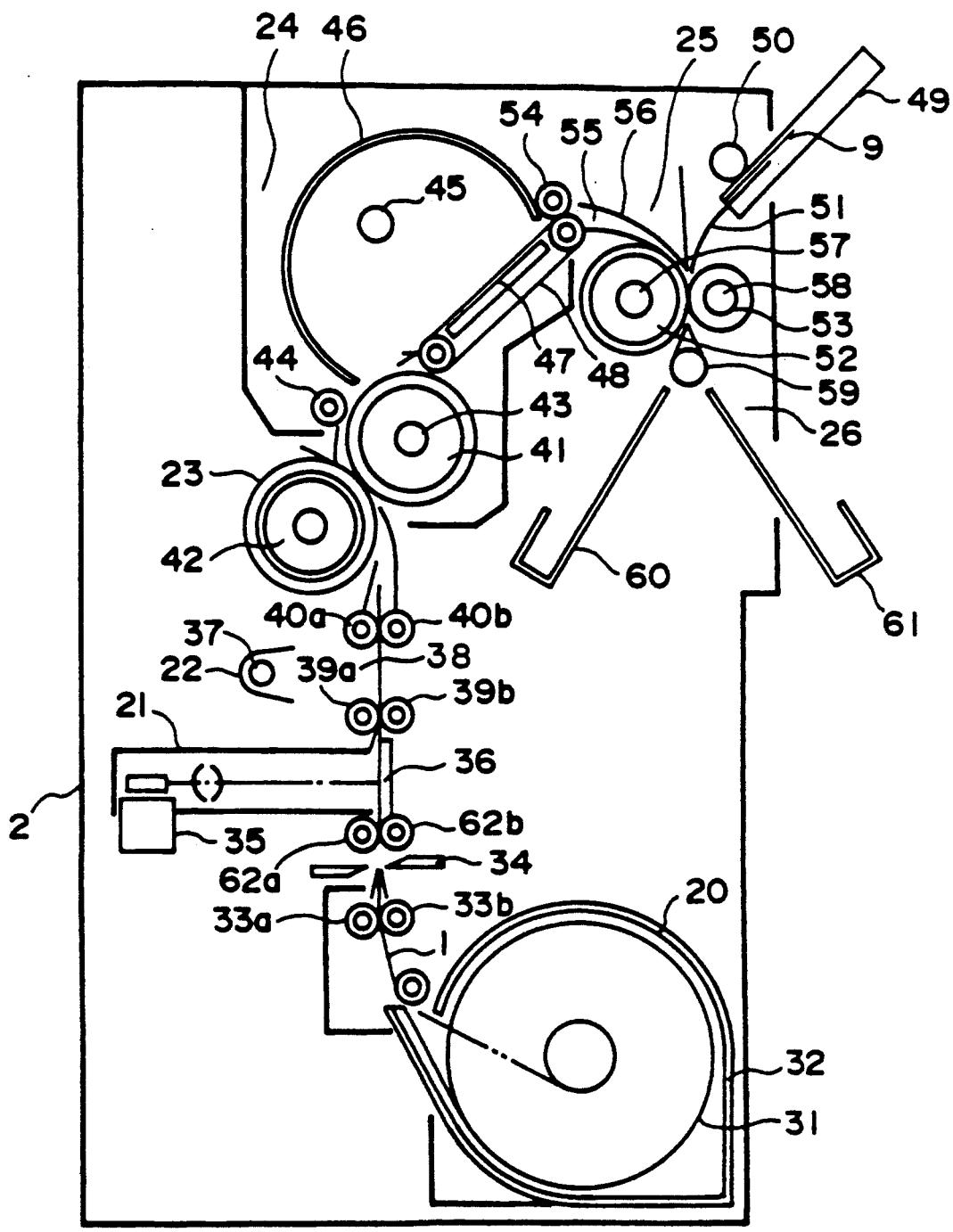
FIG. 1 is a sectional view of an image forming apparatus according to an embodiment of the present invention.
Figure 2:
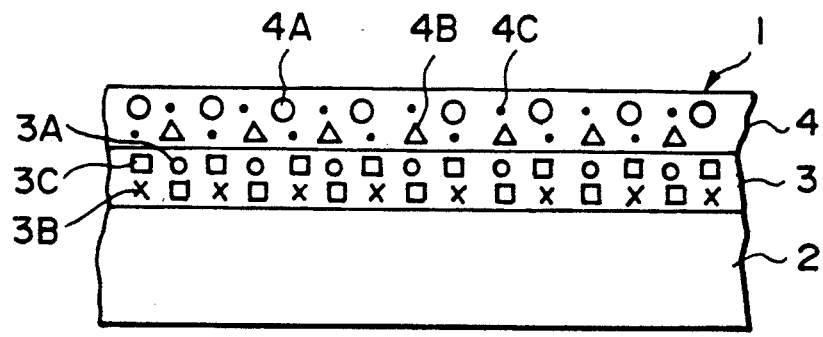

Referring to FIG. 1, there is shown an image forming apparatus according to an embodiment of the present invention in a cross-section. The image forming apparatus generally includes a sheet feeding station 20, an image exposure station 21, an auxiliary exposure station 22, a heating and developing station 23, a whole surface exposure station 24, a transfer station 25 and a sheet discharging station 26. The respective stations will be described.

(1) Feeding station 20

The sheet feeding station 20 is provided with a photosensitive member cartridge 32 accommodating a roll 31 of the photosensitive member 1. The photosensitive member cartridge 32 has an outlet, where a pair of supply rolls 33a and 33b are disposed, by which a predetermined length of the photosensitive member is fed out. The photosensitive member 1 dispensed in a predetermined length is cut by a cutter unit 34.

(2) Image exposure station 21

The photosensitive member 1 fed from the feeding station 20 is exposed to image light by a laser beam scanning exposure means 35. A supporting member 36 is effective to bear the photosensitive member 1 to suitably hold the photosensitive member 1 during the image exposure operation.

(3) Auxiliary exposure station 22

The photosensitive member 1 having been subjected to the image exposure operation is then subjected to the auxiliary exposure 38 by auxiliary exposure means 37.

(4) Heating and developing station 23

The photosensitive member 1 having been exposed to the light image is conveyed by conveying rollers 40a and 40b to the heating and developing station 23, where it is supported by a heating roll 41 and a back-up roller 42 and is heated at the temperature of approximately 120° C. to be developed. The heating source is in the form of a halogen heater 43 disposed inside the heating roll 41, in this embodiment.

(5) Whole surface exposure station 24

The developed photosensitive member 1 is then conveyed by a conveying roller 44 to the whole surface exposure station 24 which comprises a light source, a guide 46 for the light source 45, a heating plate 47 and a conveying belt 48.

(6) Transfer station 25

An image receiving material 9 is accommodated in an image receiving material cartridge 49 which is detachably mountable on the apparatus. The image receiving material 9 is supplied from the cartridge 49 by a feeding roller 5 and is supplied to image transfer rollers 52 and 53 along a conveyance guide 51.

On the other hand, the photosensitive member 1 is fed from the whole surface exposure station 24 by a conveying roller 54 along conveyance guides 55 and 56 to the transfer rollers 52 and 53. The image receiving material 9 and the photosensitive member 1 are overlaid in a predetermined positional relation in the transfer station 25. The transfer rollers 52 and 53 form a nip through which the overlaid image receiving material 9 and the photosensitive member 1 are passed. During the passage through the nip, they are heated by halogen heaters 57 and 58 disposed inside the transfer roller, by which the diffusing dye material is diffused from the photosensitive member 1 to the image receiving material to form a color image. The image transfer temperature is 7°–170° C., preferably 100°–150° C., further preferably 100°–130° C.

(7) Discharging station 26

Then, the photosensitive member 1 and the image receiving material 9 are separated from each other by a separation pawl 59, and thereafter, they are conveyed to discharge trays 60 and 61.

The light source for the imagewise exposure may be of any type if it can write the image in accordance with the image signal on the photosensitive member 1. Examples of the light source include CRT, a laser source, LED, an LED array or a fluorescent lamp, a linear light source or a two dimensional light source used with a shutter array such as a liquid crystal device, PLZT (transparent ceramic polycrystalline) or the like. It is a possible alternative to use a reflection mirror to directly write an original on the photosensitive member.

Examples of the auxiliary exposure light source include a fluorescent tube and a mercury vapor lamp.

The light source for the auxiliary exposure 38 is preferably such that the wavelength region providing substantially the maximum intensity substantially coincide with an absorption peak wavelength of the sensitive coloring material of the photosensitive member, because the effect of the auxiliary exposure is large, and the light source can be efficiently used.

The wavelength region providing substantially the maximum intensity of light by the light source for the auxiliary exposure is preferably substantially the same as the absorption peak wavelength of the silver halide and as the absorption peak wavelength of the photopolymerization initiator, because the whole surface exposure can provide partly the effect of the auxiliary exposure, thus improving the sensitivity, tone reproduction and contrast.

In the foregoing embodiment, the auxiliary exposure is performed after the imagewise exposure. It may be carried out before the image exposure, or before and after the image exposure including or excluding the image exposure duration.

In the foregoing embodiment, the heating and developing station 23 uses the heating roll having therein the halogen heater. Other possible alternatives include a combination of a heating plate and a belt or roller, a thermal head, means for flowing current therethrough, microwave heating means and infrared ray application means. In the foregoing embodiment, the photosensitive member is in the form of a roll, but it may be in the form of a cut photosensitive member repeatedly usable. In the foregoing embodiment, the heating means is disposed at the top of the apparatus, and therefore, the optical means is protected from influence by the heat or products by the heating.

Figure 10C:
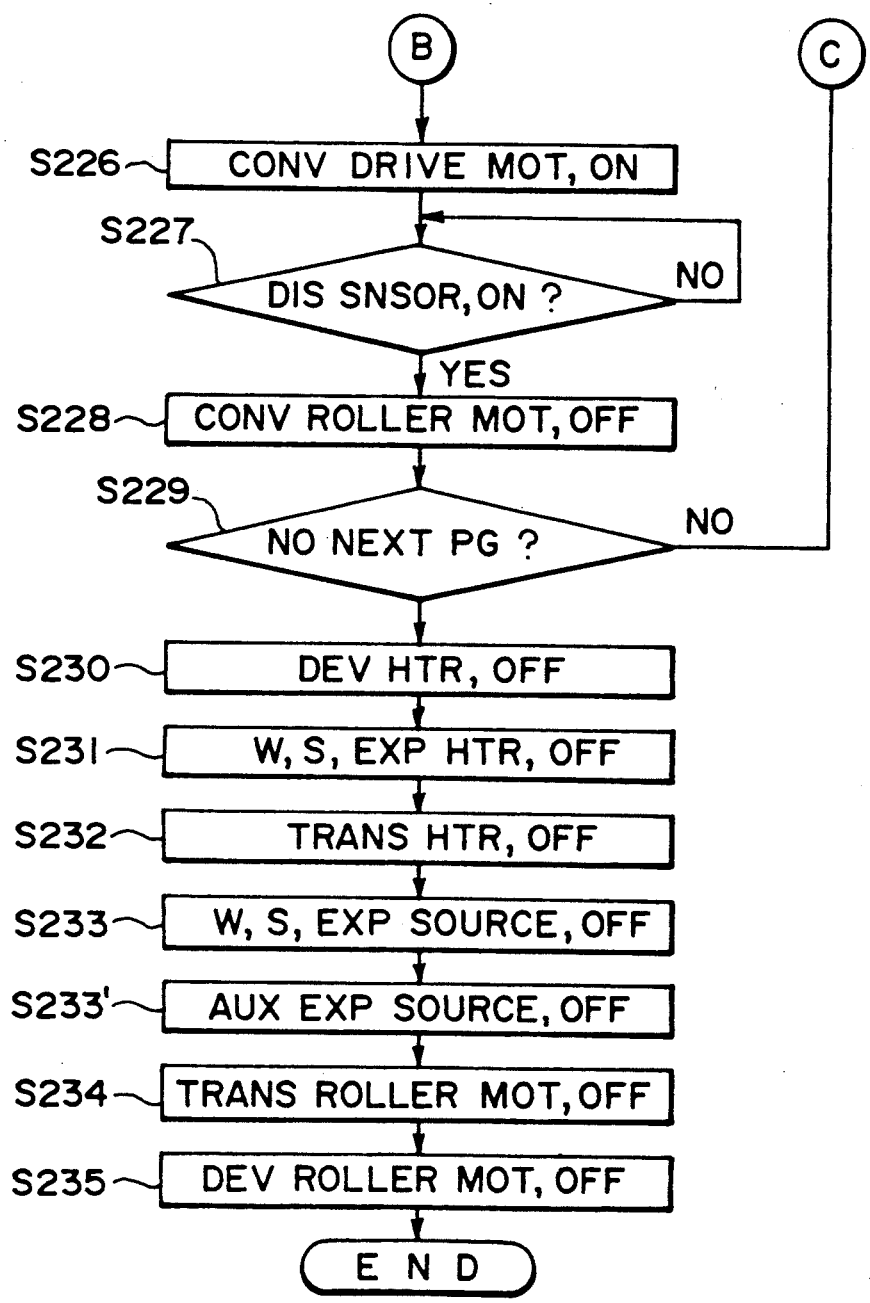
FIGS. 10, 10A, 10B and 10C are a flow chart of an operation in the apparatus of FIG. 1.
Figure 10:
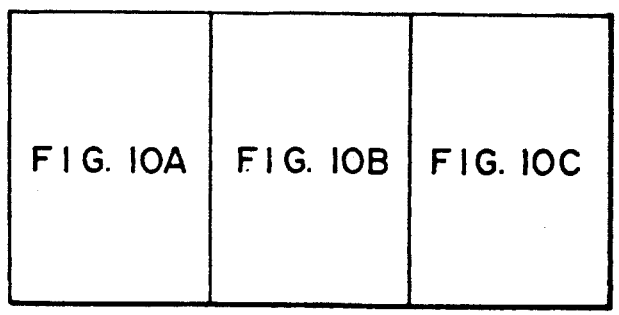
Figure 10A:
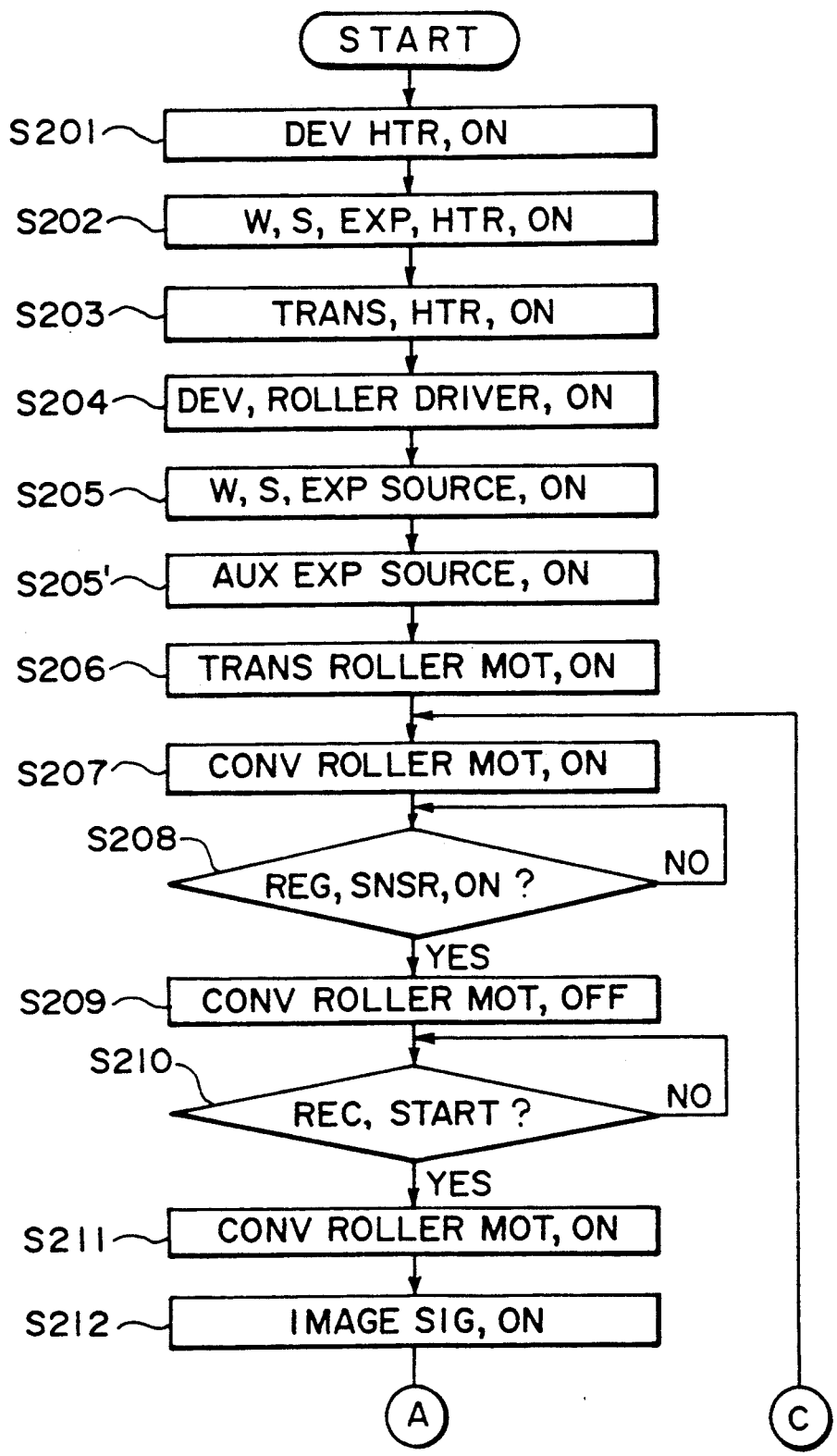
Figure 10B:
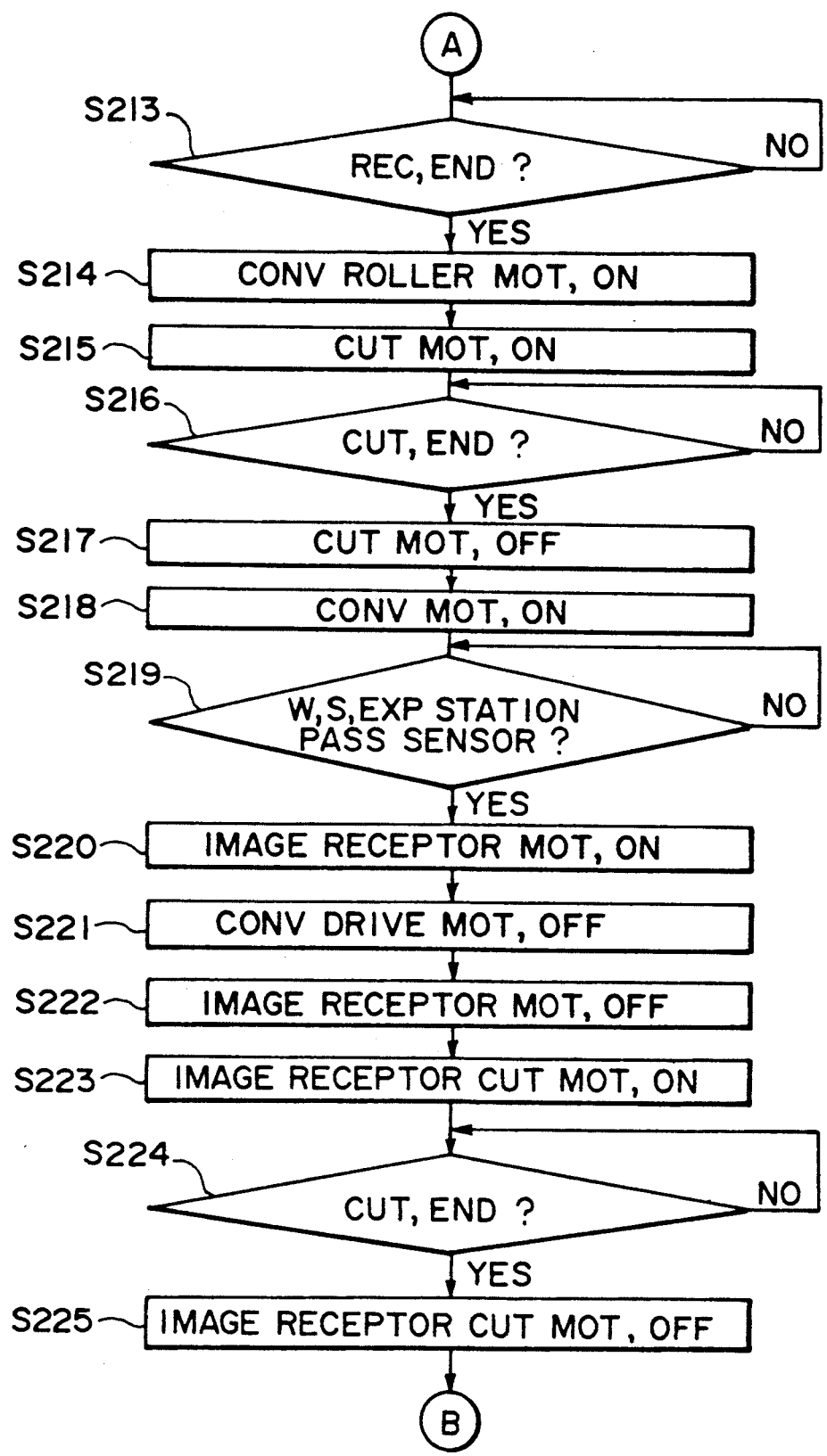

Referring to FIG. 10, the description will be made as to the operation of the apparatus. When an unshown main switch is actuated, the motor or motors for the conveying rollers and the heater or heaters of the heating source for the heating and developing station 23, the whole surface exposure station 24 and the transfer station 25 are energized, and the light sources for the auxiliary exposure and the whole surface exposure are turned on (S201-S206).

Then, the photosensitive member 1 is fed out by the feeding rollers 33a and 33b from the cartridge 32 through the sheet feeding station 200 (S207). An unshown cutter registration sensor supplies a signal to an unshown controller to stop the leading edge at the conveying roller 17 (S208 and S209). The controller receiving the signal then receives a record starting signal (S210) to resume the feeding operation (S211), and the photosensitive member 1 is exposed imagewisely (S212). Upon completion of the image exposure (S213), the photosensitive member 1 is stopped (S214), and is cut (S215). After the cutting of the photosensitive member 1 is confirmed, the sheet cut driving motor is stopped (S216, S217).

Then, the conveying roller driving motor is again actuated to convey the photosensitive member 1. The photosensitive member 1 passes through the auxiliary exposure station 22, the heating and developing station 23 and the whole surface exposure station 24. An unshown passage sensor detects passage of the photosensitive member 1 through the whole surface exposure station 24 (S219). After the passage is detected by the passage sensor, the motor for feeding the image receiving material is actuated to feed the image receiving material 9 out of the image receiving material cartridge 49 (S220).

Then, the photosensitive member 1, the image receiving material 9, the conveying roller and the driving roller are stopped (S221, S222), and the image receiving material 9 is cut (S223-S225). Subsequently, the conveying roller driving motor is actuated (S226), the photosensitive member 1 and the image receiving material 9 are passed through the nip of the transfer rollers while the photosensitive member 1 and the image receiving material 9 being overlaid with each other. After the image transfer, the photosensitive member 1 and the image receiving element 9 are separated and are discharged. Discharge sensor detects the discharge (S227)

Then, the conveying roller driving motor is deactuated (S228), and the discrimination is made as to whether or not the next recording is to be performed or not (S229) If not, the heating and developing station, the whole surface exposure station, the heating source of the transfer station, rollers, driving motors and the light sources are deenergized, and the operation stops (S230-S235).

Where the present invention is used in a dynamic photorecording system wherein a light beam scans the photosensitive member, it is desirable that the following conditions are satisfied.

Figure 11A:
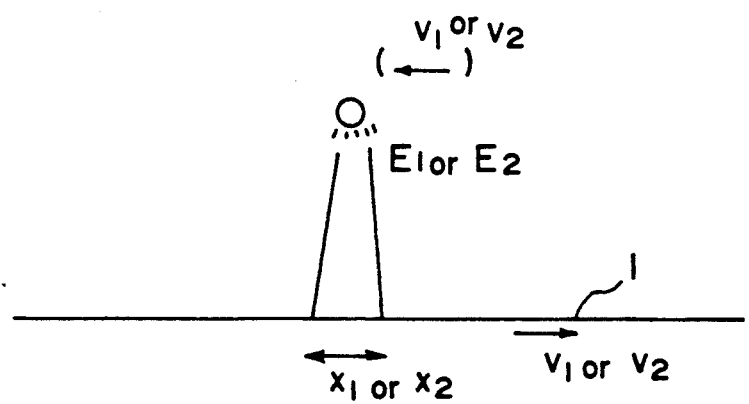
FIGS. 11A and 11B explain exposure conditions.
Figure 11B:
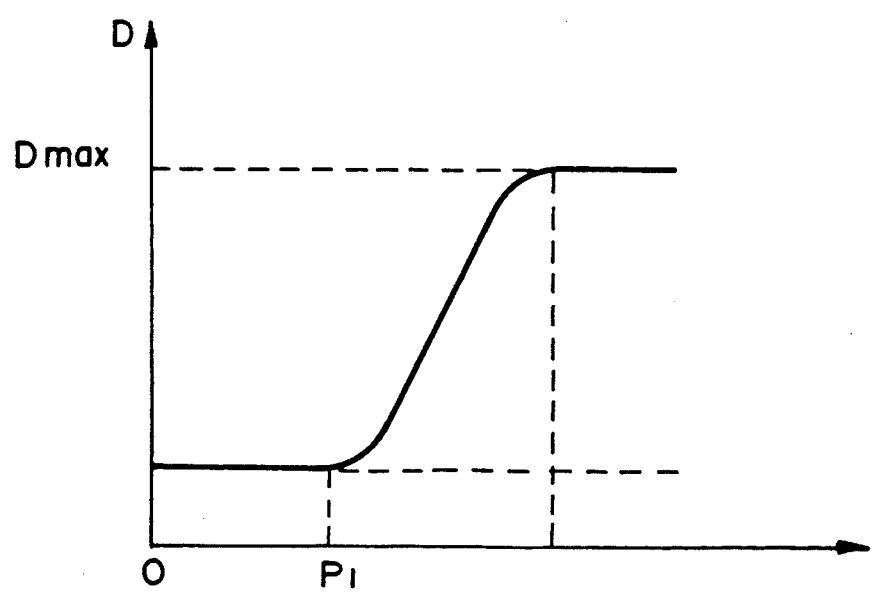

As shown in FIG. 11A, it is assumed that $E_1$ is the effective minimum exposure intensity of the imagewise exposure (minimum exposure intensity required for providing an image), $E_2$ is the exposure intensity of the auxiliary exposure, $V_1$ and $V_2$ are relative speed between the imagewise exposure and the photosensitive member and between the auxiliary exposure and the photosensitive member, and $X_1$ and $X_2$ are exposure widths, measured in the direction of the relative movement, of the imagewise exposure and the auxiliary exposure.

To accomplish effectively the auxiliary exposure, the following is preferable:

$$(X_1/V_1) < (X_2/V_2) \qquad \text{(i)}$$

$$[E_1 \times (X_1/V_1)] > [E_2 \times (X_2/V_2)] \qquad \text{(ii)}$$

As regards the condition (i), the following is further preferable:

$$(X_1/V_1) \times 10^2 < (X_2/V_2) \qquad \text{(iii)}$$

Yet further preferably, the following is satisfied:

$$(X_1/V_1) \times 10^4 < (X_2/V_2) \qquad \text{(iv)}$$

As regard $E_1 \times (X_1/V_1)$ and $E_2 \times (X_2/V_2)$, the substantial energy is different even if the exposure amount is the same, if the exposure system is different depending on whether it is a laser beam or the fluorescent beam, for example, because of the wavelength dependency of the sensitivity of the photosensitive member.

The condition (ii) is considered in terms of actual machine.

Substantial exposure intensities corresponding to $E_1$ and $E_2$ are expressed by $E_1^*$ and $E_2^*$, respectively. FIG. 3B shows a so-called $\gamma$-characteristics curve, that is, optical image density (ordinate) vs. exposure amount (exposure intensity multiplied by exposure period) (abscissa).

It is preferable that the value $E_1^* \times (X_1/V_1)$ corresponds to $P_1$, and the value $E_2^* \times (X_2/V_2)$ corresponds to between O and $P_1$ (not more than $E_1^* \times (X_1/V_1)$).

Thus, if (ii) is satisfied, the image is not influenced when only the auxiliary exposure is applied to the photosensitive member with the exposure amount of $E_2^* \times (X_2/V_2)$. In other words, the foggy background is not produced.

Figure 8A:
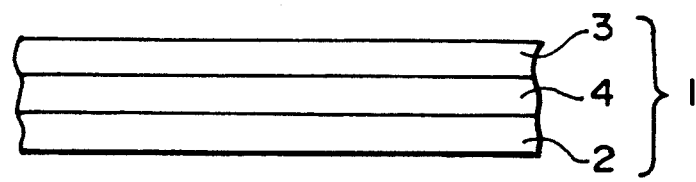
FIGS. 8A, 8B and 8C show a laminated structure of the photosensitive member used in the apparatus of the present invention.
Figure 12:
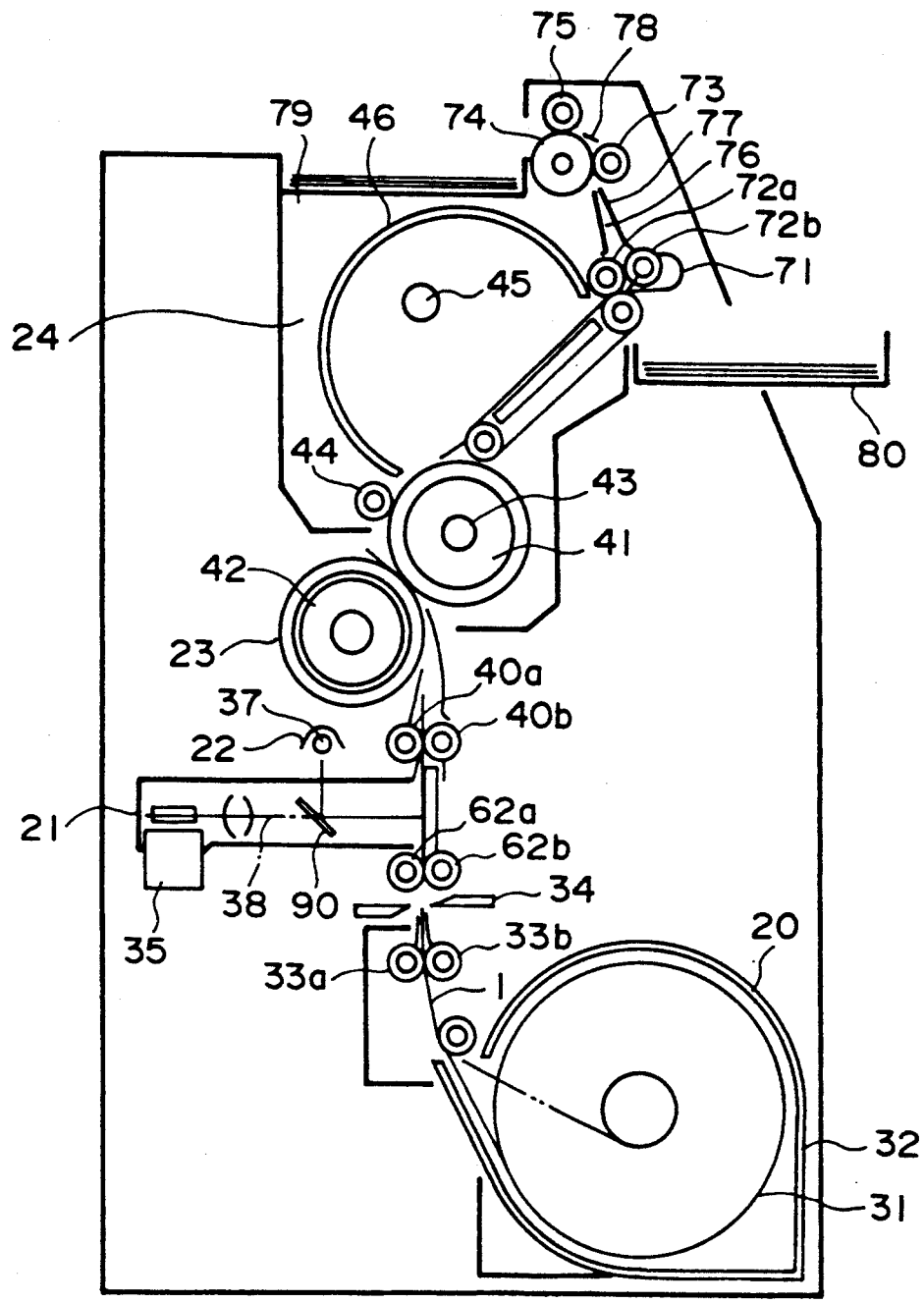
FIG. 12 is a sectional view of an apparatus according to another embodiment of the present invention.
Figure 13B:
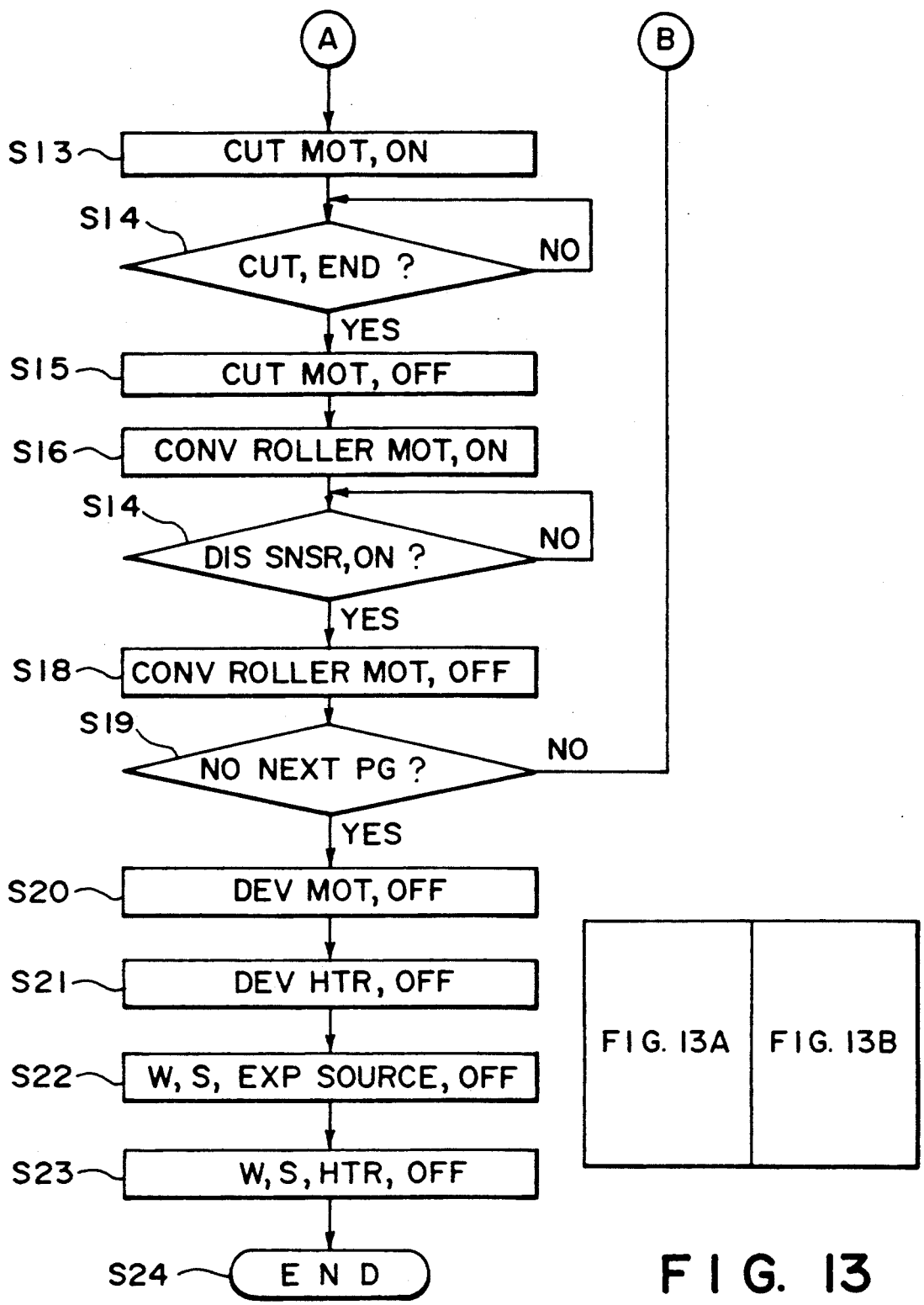
FIGS. 13A and 13B are a flow chart of an operation in the apparatus of FIG. 12.
Figure 13A:
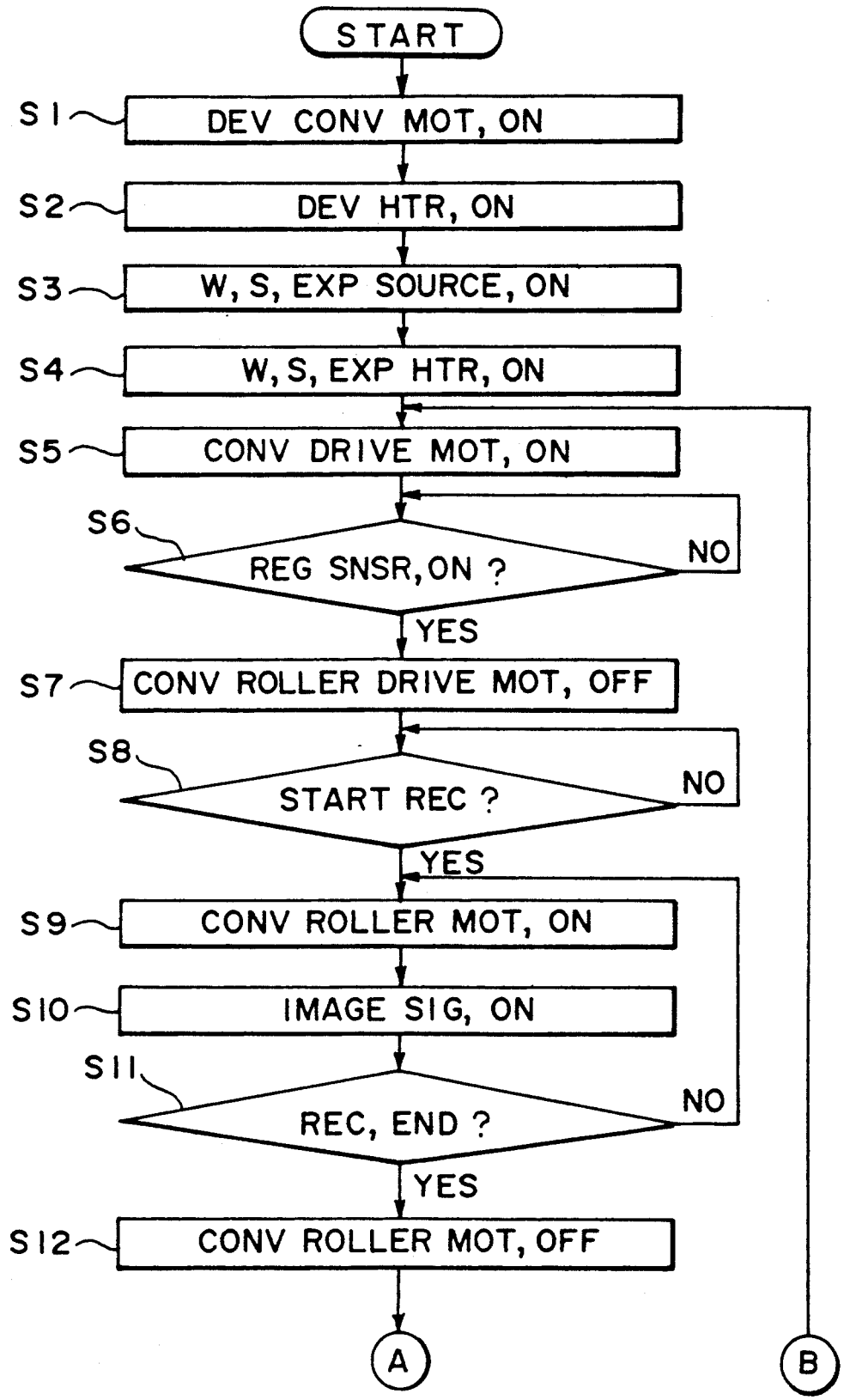

Referring to FIG. 12, the description will be made as to an image forming apparatus according to another embodiment. In this embodiment, a polymer image is formed on the photosensitive member 1 in the same manner as described with FIGS. 8 and 9. The apparatus of this embodiment comprises a separating station 27. The sheet feeding station 20, the image exposure station 21, the auxiliary exposure station 22, the heating and developing station 23, the whole surface exposure station 24 and the sheet discharging station 26 have the similar structure to those of the foregoing embodiment.

In FIG. 12, the polymerized part and the unpolymerized part after the formation of the polymer image are separated using the difference in the adhesiveness, so that the contrast of the polymer image is enhanced.

The description will be made as to the separating station 27 disposed after the whole surface exposure station 24.

Figure 8B:
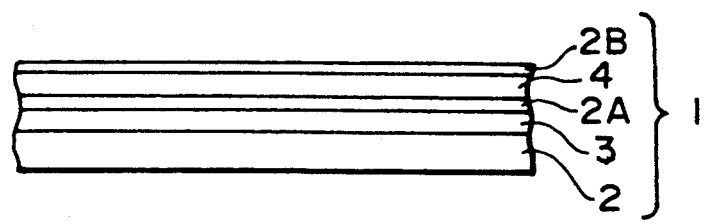
Figure 8C:
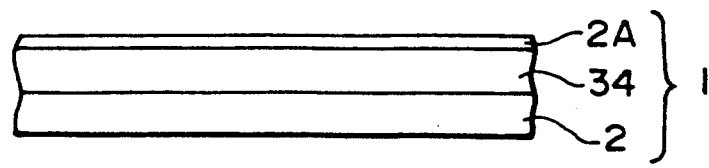

The photosensitive member 1 fed from the whole surface exposure station 24 is separated into the resin films 2 and 2A by a separating pawl 71, or into the polymerized part and the unpolymerized part. The separated resin film 2A is discharged to a discharge tray 79 by conveying rollers 72a, 72b, 73, 74 and 75 along conveyance guides 76, 77 and 78. The resin film 2 is conveyed to a discharge tray 80. The photosensitive member 1 is as shown in FIG. 8B, and a polymer image is formed by the difference in the adhesiveness in the polymerization layer. After the polymer image is formed, the intermediate layer 2A is separated, the unpolymerized part is adhered to the intermediate layer 2A and is separated from the resin layer 2. By this, the contrast of the polymer image is enhanced. If light is projected through the image having the unpolymerized part, a negative image, with respect to the image formed by the polymerized part, can be formed. Using the apparatus of this embodiment, a positive polymer image and a negative polymer image can be formed.

In this embodiment, the separating means is in the form of a separation pawl. Other alternatives include a scraper, separating means using the adhesiveness difference to the two layers and means for separating using the relative speed difference with the rollers sandwiching the photosensitive member.

Figure 3:
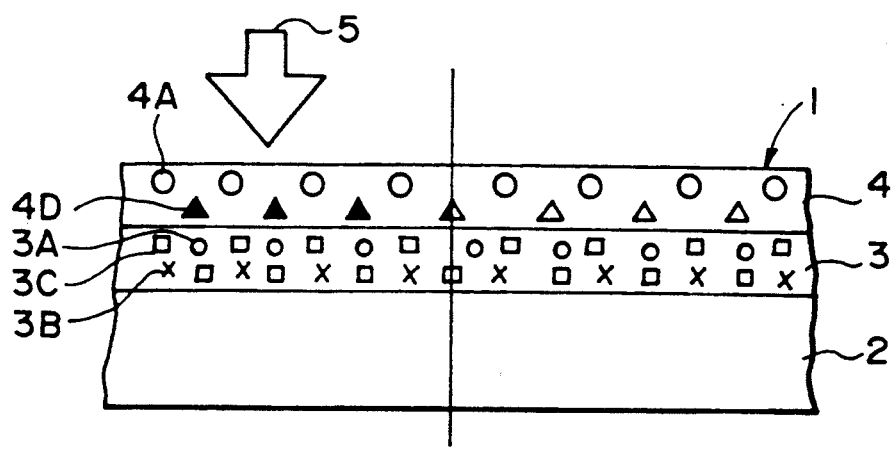
Figure 4:
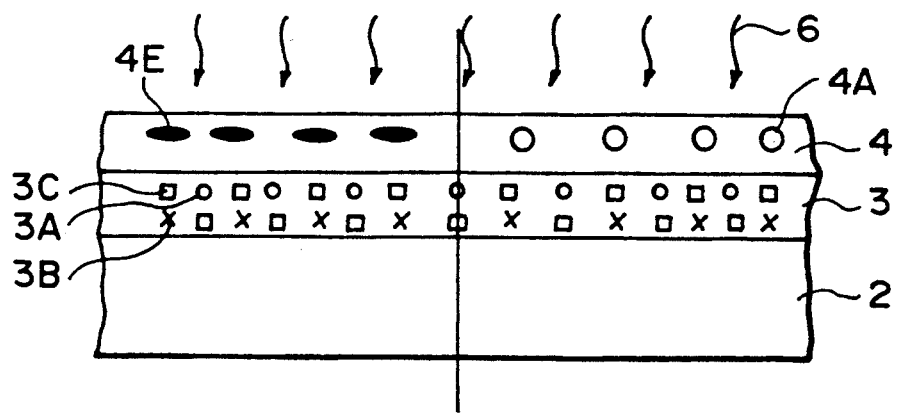

Referring to FIG. 3, the description will be made as to the operation of the image forming apparatus using the photosensitive member 1 described above, according to this embodiment.

When an unshown main switch is actuated, conveying roller driving motor and heater for the heating and developing station 23 and the whole surface exposure station 24, and the light sources are energized (S1, S2, S3 and S4).

Then, the photosensitive member 1 is fed out of the cartridge 32 through the feeding station 20 by the feeding rollers 33a and 33b (S5). An unshown cutter sensor detects the leading edge, and supplies a signal to an unshown controller to stop the leading edge of the photosensitive member 1 at the conveying roller 62 (S6 and S7). The controller receiving the signal, receives the record starting signal (S8), upon which the feeding of the photosensitive member 1 is resumed (S9). Then, the image signal is supplied to the image exposure station (S10), by which the image is written in the photosensitive member 1 (S11). After the completion of the writing, the conveyance of the photosensitive member 1 is stopped, and is cut (S12).

After the sheet cutting is confirmed, the cutting motor is deactuated (S14 and S15). Then, the conveyance is resumed, so that the photosensitive member 1 is passed through the auxiliary exposure station 22, the heating and developing station 23 and the hole surface exposure station 24. Then, it is separated into two sheets by the separation pawl 71. Then, the resin sheet 2 is discharged to the discharge portion 80, and the resin sheet 2a is discharged to the discharge portion 79. At this time, the discharge is confirmed by an unshown sheet discharge sensor means, and then, the conveying roller driving motor is deactuated.

Then, the discrimination is made as to whether the next page is to be recorded or not. If so, the feeding operation is effected again. If not, the driving motor for the heating and developing station and the heater is deactuated, and also, the auxiliary exposure light source, the whole surface exposure light source and the heater are deactuated, so that the operation is terminated (S20–S24).

Referring to FIG. 14, another example of the auxiliary exposure station 22 will be described. Designated by a reference numeral 13 in FIG. 14 is a wavelength selecting transparent mirror which transmits the image exposure wavelength component but reflects the auxiliary exposure wavelength component. The image exposure beam (information light) 5 reflected by a polygonal mirror travels through the mirror 90 and is incident on the photosensitive member 1. On the other hand, the auxiliary exposure light 38 emitted from the light source 37 is reflected by the mirror 13 to be incident on the region including the image exposure region.

While the invention has been described with reference to the structures disclosed herein, it is not confined to the details set forth and this application is intended to cover such modifications or changes as may come within the purposes of the improvements or the scope of the following claims.

What is claimed is:

1. An image forming apparatus using dry silver salt material, comprising:
    a photosensitive member having a base material and reducing material, photosensitive silver halide and organic silver salt which are on the base material;
    means for projecting digital information light onto said photosensitive member;
    means for uniformly heating said photosensitive member; and
    auxiliary exposure means disposed upstream of said uniform heating means with respect to movement direction of said photosensitive member for uniformly exposing an entire surface of said photosensitive member.

2. An apparatus according to claim 1, wherein said heating means is disposed above and downstream of said information light projecting means, with respect to a movement direction of said photosensitive member, and said apparatus further comprising exposure means, disposed downstream of said heating means, for uniformly exposing said photosensitive member to light.

3. An image forming apparatus using dry silver salt material, comprising:

a photosensitive member having a base material and reducing material, photosensitive silver halide and organic silver salt which are on the base material;

means for projecting digital information light onto said photosensitive member;

means for uniformly heating said photosensitive member, said heating means being disposed above and downstream of said information light projecting means; and auxiliary exposure means disposed upstream of said uniform heating means with respect to movement direction of said photosensitive member for uniformly exposing an entire surface of said photosensitive member.

4. An apparatus according to claim 3, further comprising whole surface exposure means for uniformly exposing said photosensitive member to light downstream of said heating means.

5. An image forming apparatus using dry silver salt material, comprising:

a photosensitive member having a base material and reducing material, photosensitive silver halide and organic silver salt which are on the base material;

means for projecting digital information light onto said photosensitive member;

auxiliary exposure means for uniformly exposing an entire surface of said photosensitive member; and means for uniformly heating said photosensitive member, wherein $$(X_1/V_1)<(X_2/V_2)$$

$$E_1\times(X_1/V_1)>E_2\times(X_2/V_2)$$

where $E_1$ is an effective minimum exposure intensity of said information light projecting means, $E_2$ is an exposure intensity of said auxiliary exposure means, $V_1$ is a relative speed between said information light application means and said photosensitive member, $V_2$ is a relative speed between said auxiliary means and said photosensitive member; $X_1$ is an exposure width measured in the direction of relative movement of the information light projecting means and $X_2$ is an exposure width measured in the direction of the relative movement of the auxiliary exposure means.

6. An apparatus according to claim 5, wherein $$(X_1/V_1)\times 10^2<(X_2/V_2).$$

7. An apparatus according to claim 5, wherein $$(X_1/V_1)\times 10^4<(X_2/V_2).$$

8. An image forming apparatus using dry silver salt material, comprising:

a photosensitive member having a base material and reducing material, photosensitive silver halide and organic silver salt which are on the base material;

means for projecting digital information light onto said photosensitive member;

auxiliary exposure means for uniformly exposing an entire surface of said photosensitive member, said auxiliary exposure means being separated from said information light projecting means; and means for uniformly heating said photosensitive member, wherein $$(X_1/V_1)<(X_2/V_2)$$

$$E_1\times(X_1/V_1)>E_2\times(X_2/V_2)$$

where $E_1$ is an effective minimum exposure intensity of said information light projecting means, $E_2$ is an exposure intensity of said auxiliary exposure means, $V_1$ is a relative speed between said information light application means and said photosensitive member, $V_2$ is a relative speed between said auxiliary exposure means and said photosensitive member; $X_1$ is an exposure width measured in the direction of relative movement of the information light projecting means and $X_2$ is an exposure width measured in the direction of the relative movement of the auxiliary exposure means.

9. An apparatus according to claim 8, wherein a wavelength of the light by said auxiliary exposure means is substantially the same as a sensitive wavelength of said photosensitive member.

10. An apparatus according to claim 8, wherein said information light projecting means includes a laser beam scanning optical system.

11. An image forming apparatus using dry silver salt material, comprising:

a photosensitive member having a base material, monomer and photopolymerization initiating material thereon, and reducing material, photosensitive silver halide and organic silver salt;

means for projecting digital information light onto said photosensitive member;

auxiliary exposure means for uniformly exposing an entire surface of said photosensitive member; and means for uniformly heating said photosensitive member.

12. An apparatus according to claim 11, wherein said heating means is disposed above and downstream of said information light projecting means, with respect to a movement direction of said photosensitive member, and said apparatus further comprising exposure means, disposed downstream of said heating means, for uniformly exposing said photosensitive member to light.

13. An image forming apparatus using dry silver salt material, comprising:

a photosensitive member having a base material, monomer and photopolymerization initiating material thereon, and reducing material, photosensitive silver halide and organic silver salt;

means for projecting digital information light onto said photosensitive member;

means for uniformly heating said photosensitive member, said heating means being disposed above and downstream of said information light projecting means; and auxiliary exposure means disposed upstream of said uniform heating means with respect to movement direction of said photosensitive member for uniformly exposing an entire surface of said photosensitive member.

14. An apparatus according to claim 13, further comprising whole surface exposure means for uniformly exposing said photosensitive member to light downstream of said heating means.

15. An image forming apparatus using dry silver salt material, comprising:

a photosensitive member having a base material, monomer and photopolymerization initiating material thereon, and reducing material, photosensitive silver halide and organic silver salt;

means for projecting digital information light onto said photosensitive member;

auxiliary exposure means for uniformly exposing an entire surface of said photosensitive member, and means for uniformly heating said photosensitive member, wherein $$(X_1/V_1) < (X_2/V_2)$$

$$E_1 \times (X_1/V_1) > E_2 \times (X_2/V_2)$$

where $E_1$ is an effective minimum exposure intensity of said information light projecting means, $E_2$ is an exposure intensity of said auxiliary exposure means, $V_1$ is a relative speed between said information light application means and said photosensitive member, $V_2$ is a relative speed between said auxiliary exposure means and said photosensitive member; $X_1$ is an exposure width measured in the direction of relative movement of the information light projecting means and $X_2$ is an exposure width measured in the direction of the relative movement of the auxiliary exposure means, wherein said auxiliary exposure means is disposed upstream of said uniform heating means with respect to movement direction of said photosensitive member.

16. An apparatus according to claim 15, wherein $$(X_1/V_1) \times 10^2 < (X_2/V_2).$$

17. An apparatus according to claim 15, wherein $$(X_1/V_1) \times 10^4 < (X_2/V_2).$$

18. An image forming apparatus using dry silver salt material, comprising:

a photosensitive member having a base material, monomer and photopolymerization initiating material thereon, and reducing material, photosensitive silver halide and organic silver salt;

means for projecting digital information light onto said photosensitive member;

auxiliary exposure means for uniformly exposing an entire surface of said photosensitive member, said auxiliary exposure means being separated from said information light projecting means; and means for uniformly heating said photosensitive member, wherein $$(X_1/V_1) < (X_2/V_2)$$

$$E_1 \times (X_1/V_1) > E_2 \times (X_2/V_2)$$

where $E_1$ is an effective minimum exposure intensity of said information light projecting means, $E_2$ is an exposure intensity of said auxiliary exposure means, $V_1$ is a relative speed between said information light application means and said photosensitive member, $V_2$ is a relative speed between said auxiliary exposure means and said photosensitive member; $X_1$ is an exposure width measured in the direction of relative movement of the information light projecting means and $X_2$ is an exposure width measured in the direction of the relative movement of the auxiliary exposure means.

19. An apparatus according to claim 18, wherein a wavelength of the light by said auxiliary exposure means is substantially the same as a sensitive wavelength of said photosensitive member.

20. An apparatus according to claim 18, wherein said information light projecting means includes a laser beam scanning optical system.

* * * * *